(12) United States Patent
Chung et al.

(10) Patent No.: US 8,133,784 B2
(45) Date of Patent: Mar. 13, 2012

(54) METHOD OF FABRICATING NON-VOLATILE MEMORY DEVICE HAVING VERTICAL STRUCTURE

(75) Inventors: Dew-ill Chung, Suwon-si (KR); Han-soo Kim, Suwon-si (KR); Jae-hun Jeong, Hwaseong-si (KR); Jin-soo Lim, Seoul (KR); Ki-hyun Kim, Hwaseong-si (KR); Ju-young Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 323 days.

(21) Appl. No.: 12/588,534

(22) Filed: Oct. 19, 2009

(65) Prior Publication Data
US 2010/0248439 A1    Sep. 30, 2010

(30) Foreign Application Priority Data

Mar. 26, 2009    (KR) .................... 10-2009-0025853

(51) Int. Cl.
*H01L 21/8238* (2006.01)
*H01L 21/336* (2006.01)
*H01L 21/8236* (2006.01)

(52) U.S. Cl. ......... 438/268; 438/257; 438/212; 438/276

(58) Field of Classification Search .................. 438/268, 438/287, 261, 257, 593, 262, 238, 212, 259, 438/270, 588, 589, 587, 591, 585, 720, 74, 438/137, 138, 156, 197, 192, 206, 269, 276
See application file for complete search history.

(56) References Cited

U.S. PATENT DOCUMENTS

| 6,534,868 B2 * | 3/2003 | Sekiguchi | 257/758 |
| 7,125,795 B2 * | 10/2006 | Kuo et al. | 438/637 |
| 2008/0242025 A1 * | 10/2008 | Kim et al. | 438/262 |
| 2009/0315095 A1 * | 12/2009 | Kim et al. | 257/314 |

FOREIGN PATENT DOCUMENTS

| JP | 2007-180389 | 7/2007 |
| JP | 2008-72051 | 3/2008 |
| JP | 2008-171838 | 7/2008 |

* cited by examiner

*Primary Examiner* — Chuong A. Luu
(74) *Attorney, Agent, or Firm* — Harness, Dickey & Pierce, P.L.C.

(57) ABSTRACT

A method of fabricating a non-volatile memory device according to an example embodiment may include etching a plurality of sacrificial films and insulation films to form a plurality of first openings that expose a plurality of first portions of a semiconductor substrate. A plurality of channel layers may be formed in the plurality of first openings so as to coat the plurality of first portions of the semiconductor substrate and side surfaces of the plurality of first openings. A plurality of insulation pillars may be formed on the plurality of channel layers so as to fill the plurality of first openings. The plurality of sacrificial films and insulation films may be further etched to form a plurality of second openings that expose a plurality of second portions of the semiconductor substrate. A plurality of side openings may be formed by removing the plurality of sacrificial films. A plurality of gate dielectric films may be formed on surfaces of the plurality of side openings. A plurality of gate electrodes may be formed on the plurality of gate dielectric films so as to fill the plurality of side openings.

20 Claims, 10 Drawing Sheets

METHOD OF FABRICATING NON-VOLATILE MEMORY DEVICE HAVING VERTICAL STRUCTURE

CROSS-REFERENCE TO RELATED APPLICATION

This application claims priority under 35 U.S.C. §119 to Korean Patent Application No. 10-2009-0025853, filed on Mar. 26, 2009 with the Korean Intellectual Property Office, the entire disclosure of which is incorporated herein by reference.

BACKGROUND

1. Technical Field

This application relates to a method of fabricating a semiconductor device, and more particularly, to a method of fabricating a non-volatile memory device having a vertical structure in which a plurality of memory cells are arranged in series in a vertical direction.

2. Description of the Related Art

When an external power supply to a non-volatile semiconductor memory device is stopped, memory data is maintained in the non-volatile memory device. Non-volatile memory devices are commonly used in computers as a memory card. Conventional non-volatile memory devices have a structure wherein a plurality of memory cells are arranged on a substrate in a flat or horizontal manner. A non-volatile memory device having such a structure is more limited with regard to miniaturization, integration, and mass storage due to a reduction in a design rule.

SUMMARY

A non-volatile memory device according to an example embodiment may have a vertical structure. A method of fabricating the non-volatile memory device may include alternately stacking a plurality of sacrificial films and a plurality of insulation films on a semiconductor substrate. The plurality of sacrificial films and the plurality of insulation films may be etched to form a plurality of first openings that expose a plurality of first portions of the semiconductor substrate. A plurality of channel layers may be formed in the plurality of first openings so as to coat the plurality of first portions of the semiconductor substrate and side surfaces of the plurality of first openings. A plurality of insulation pillars may be formed on the plurality of channel layers so as to fill the plurality of first openings. The plurality of sacrificial films and the plurality of insulation films may be further etched to form a plurality of second openings that expose a plurality of second portions of the semiconductor substrate. The plurality of sacrificial films exposed by the plurality of second openings may be removed to form a plurality of side openings that expose parts of the plurality of channel layers. A plurality of gate dielectric films may be formed on surfaces of the plurality of side openings. A plurality of gate electrodes may be formed on the plurality of gate dielectric films such that the plurality of side openings are filled. Impurities may be ion-injected into the plurality of second portions of the semiconductor substrate to form a plurality of common conjunction regions.

The plurality of gate electrodes may include a ground selecting gate electrode, a plurality of memory cell gate electrodes, and a string selecting gate electrode. The ground selecting gate electrode may be arranged in the lowest side opening of the plurality of side openings. The string selecting gate electrode may be arranged in the highest side opening of the plurality of side openings. The plurality of memory cell gate electrodes may be arranged in the side openings between the lowest side opening and the highest side opening.

The plurality of insulation films may include an upper insulation film, intermediate insulation films, and a lower insulation film. The upper insulation film may be arranged between the string selecting gate electrode and an adjacent memory cell gate electrode. The lower insulation film may be arranged between the ground selecting gate electrode and an adjacent memory cell gate electrode. The intermediate insulation films may be arranged between the upper insulation film and the lower insulation film. The thickness of the upper insulation film and the lower insulation film may be greater than the thickness of the intermediate insulation films arranged between the memory cell gate electrodes.

The plurality of sacrificial films may include a material having an etching selectivity relative to the plurality of insulation films. The plurality of sacrificial films may include silicon oxide films, and the plurality of insulation films may include silicon nitride films.

The upper insulation film and the lower insulation film may include a material having a dielectric constant lower than that of the intermediate insulation films. The upper insulation film and the lower insulation film may include silicon oxide films, and the intermediate insulation films may include silicon nitride films.

Forming the plurality of gate dielectric films and the plurality of gate electrodes may include forming a dielectric film on surfaces of the plurality of second openings, the plurality of side openings, and the plurality of second portions of the semiconductor substrate. A conductive film may be formed on the dielectric film such that the plurality of side openings and the plurality of second openings are filled. The dielectric film and conductive film in the plurality of second openings may be etched back to form the plurality of gate dielectric films and gate electrodes.

The plurality of gate dielectric films may include oxide-nitride-alumina (ONA) or oxide-nitride-oxide-alumina (ONOA). The plurality of channel layers may include polysilicon films.

BRIEF DESCRIPTION OF THE DRAWINGS

Example embodiments may be more clearly understood when the following detailed description taken in conjunction with the accompanying drawings in which.

DETAILED DESCRIPTION

Hereinafter, example embodiments will now be described more fully with reference to the accompanying drawings. The example embodiments may, however, be embodied in many different forms and should not be construed as being limited to the instances set forth herein. Rather, the example embodiments herein are merely provided to help convey various concepts to those of ordinary skill in the art. In the drawings, the size of each element may have been exaggerated for clarity. Like reference numerals denote like elements throughout.

Figure 1:
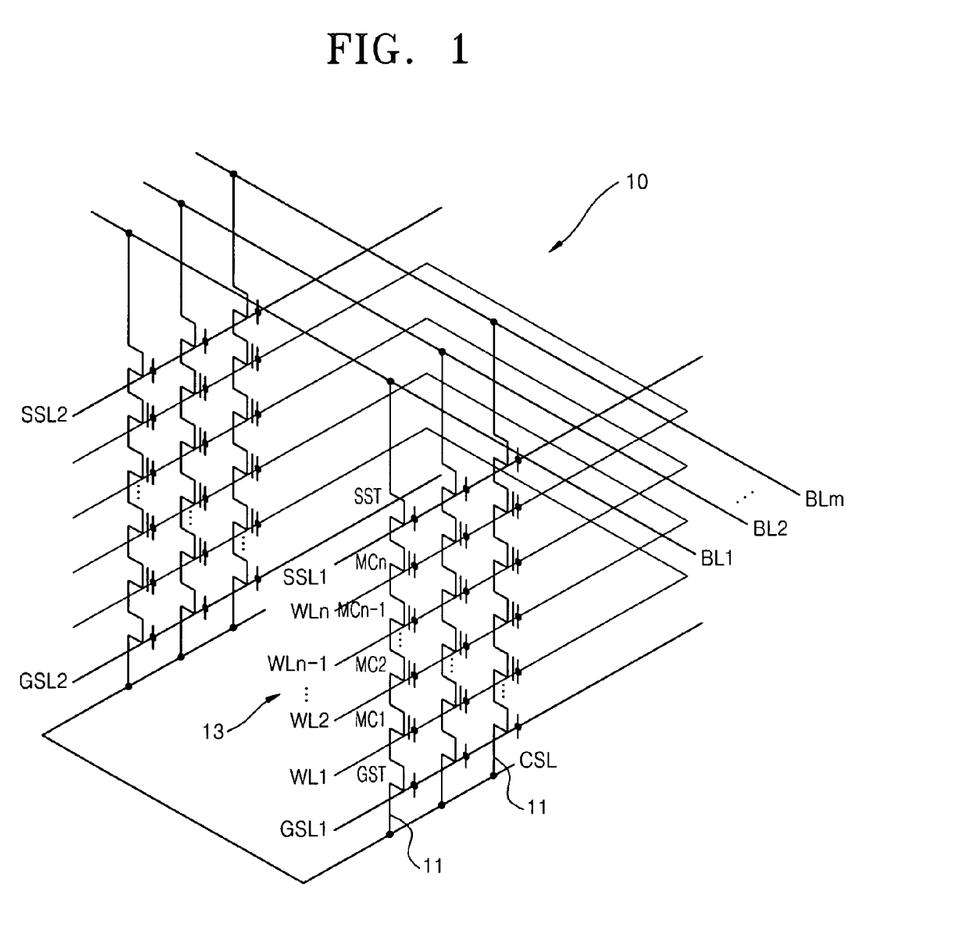
FIG. 1 illustrates a memory cell array structure of a non-volatile memory device having a vertical structure according to an example embodiment.

FIG. 1 illustrates a memory cell array structure of a non-volatile memory device having a vertical structure according to an example embodiment. Referring to FIG. 1, a memory cell array 10 may include a plurality of NAND cell string units 11. The plurality of NAND cell string units 11 may be arranged in a matrix of rows and columns. A memory cell block 13 may include the plurality of NAND cell string units 11 that are arranged in the same rows and columns.

Each of the plurality of NAND cell string units 11 may include a plurality of memory cells $MC_1$-$MC_n$, a string selecting transistor (SST), and a ground selecting transistor (GST). The GSTs, the pluralities of memory cells $MC_1$-$MC_n$, and the SSTs included in the NAND cell string units 11 may be arranged in series in a vertical direction.

1st through mth bit lines $BL_1$-$BL_m$ may be connected to one end of the NAND cell string units 11 arranged in 1st through mth rows of the memory cell block 13, e.g., connected to drains of the SSTs. A common source line (CSL) may be connected to the other end of the NAND cell string units 11, e.g., connected to sources of the GSTs.

The memory cells $MC_1$-$MC_n$ may be arranged between the SSTs and the GSTs in series in the vertical direction. Word lines $WL_1$-$WL_n$ may be commonly connected to gates of the memory cells $MC_1$-$MC_n$ arranged on the same layer, respectively. Data may be programmed, read, and erased from the memory cells $MC_1$-$MC_n$ according to driving of the word lines $WL_1$-$WL_n$.

The SSTs may be disposed between the 1st through mth bit lines $BL_1$-$BL_m$ and the memory cells $MC_1$-$MC_n$. The SSTs arranged in the memory cell block 13 may control transmission of data between the 1st through mth bit lines $BL_1$-$BL_m$ and the memory cells $MC_1$-$MC_n$ by first and second string selecting lines $SSL_1$ and $SSL_2$ connected to gates of the SSTs. Although a single transistor is arranged for each of the SST in the present example embodiment, a pair of transistors may be arranged in series between the 1st through mth bit lines $BL_1$-$BL_m$ and the memory cells $MC_1$-$MC_n$, and the first and second string selecting lines $SSL_1$ and $SSL_2$ may be commonly connected to gates of the pair of transistors.

The GSTs may be arranged between the memory cells $MC_1$-$MC_n$ and the CSL. The GSTs arranged in the memory cell block 13 may control transmission of data between the memory cells $MC_1$-$MC_n$ and the CSL by first and second ground selecting lines $GSL_1$ and $GSL_2$ connected to the gates. Although a single transistor is illustrated as being arranged for each GST, a pair of transistors may be arranged in series between the memory cells $MC_1$-$MC_n$ and the CSL, and the first and second ground selecting lines $GSL_1$ and $GSL_2$ may be commonly connected to gates of the pair of transistors.

Figure 2:
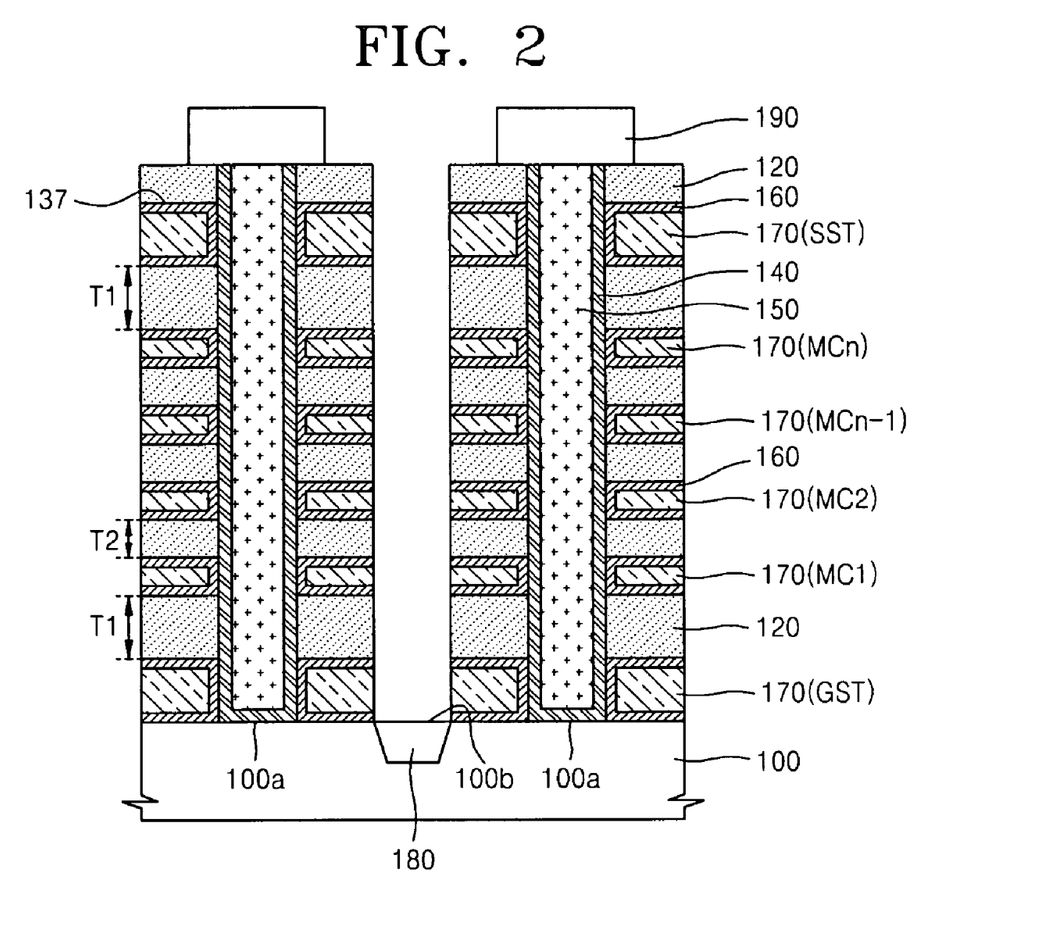
FIG. 2 is a schematic cross-sectional view of the non-volatile memory device of FIG. 1, taken along a direction of the word lines.

FIG. 2 is a schematic cross-sectional view of the non-volatile memory device of FIG. 1. The cross-sectional view is taken along a direction of the word lines of FIG. 1. Although the same bit line may be connected to cell strings arranged in the same row, the bit lines may also be arranged in a pair of cell string units for convenience of description.

Referring to FIGS. 1 and 2, the non-volatile memory device may include a substrate 100. The substrate 100 may include a semiconductor substrate, e.g., a IV group semiconductor substrate, a III-V group compound semiconductor substrate, or a II-VI group oxide semiconductor substrate. For example, the substrate 100 including a IV group semiconductor substrate may include a silicone substrate, a germanium substrate, or a silicon-germanium substrate. The substrate 100 may also/instead include a bulk wafer or an epitaxial layer.

A plurality of insulation pillars 150 may be arranged on the substrate 100 and extend vertically from the surface of the semiconductor substrate 100. Each of a plurality of semiconductor layers 140 may be arranged to surround the lower surface and side surfaces of each insulation pillar 150. The semiconductor layers 140 act as channel layers and may be formed to contact first portions 100a of the substrate 100.

The cell string units 11 may be arranged on the semiconductor layers 140 arranged on side surfaces of the insulation pillars 150. A plurality of insulation films 120 are stacked on the surface of the semiconductor substrate 100 vertically so that a plurality of side openings 137 through which parts of the semiconductor layers 140 are exposed may be defined on both sides of the insulation pillars 150.

A plurality of gate dielectric films 160 may be arranged on surfaces of the side openings 137. A plurality of gate electrodes 170 that are filled in the side openings 137 may be formed on the gate dielectric films 160. Among the gate electrodes 170, the lowest gate electrode 170 GST may act as a ground selecting gate electrode, the highest gate electrode 170 SST may act as a string selecting gate electrode, and intermediate gate electrodes 170 $MC_1$-$MC_n$ arranged between the lowest gate electrode 170 GST and the highest gate electrode 170 SST may act as memory cell gate electrodes.

Although not shown, the gate dielectric films 160 may include charge tunneling layers, charge storage layers, and charge blocking layers. The charge tunneling layers may allow charges to tunnel to the charge storage layers by Fowler-Nordheim (FN) tunneling. The charge storage layers may store charges in charge trapping layers. The gate dielectric films 160 may contain oxide-nitride-alumina (ONA) or oxide-nitride-oxide-alumina (ONOA).

Among the insulation films 120, a thickness T1 of an upper insulation film arranged between the highest gate electrode 170 SST and the memory cell gate electrode 170 $MC_n$, which is adjacent to the highest gate electrode 170 SST, and between a lower insulation film arranged between the lowest gate electrode 170 GST and the memory cell gate electrode 170 $MC_1$ may be greater than a thickness T2 of intermediate insulation films arranged between the intermediate gate electrodes 170 $MC_1$-$MC_n$.

A plurality of second portions 100b of the semiconductor substrate 100 may be exposed between the cell string units 11, and an impurity region 180 may be arranged in the exposed second portions 100b of the substrate 100. The impurity region 180 may include a common source region. The impurity region 180 may be electrically connected to the CSL shown in FIG. 1. A plurality of bit lines 190 may be arranged to contact the semiconductor layers 140.

Figure 3:
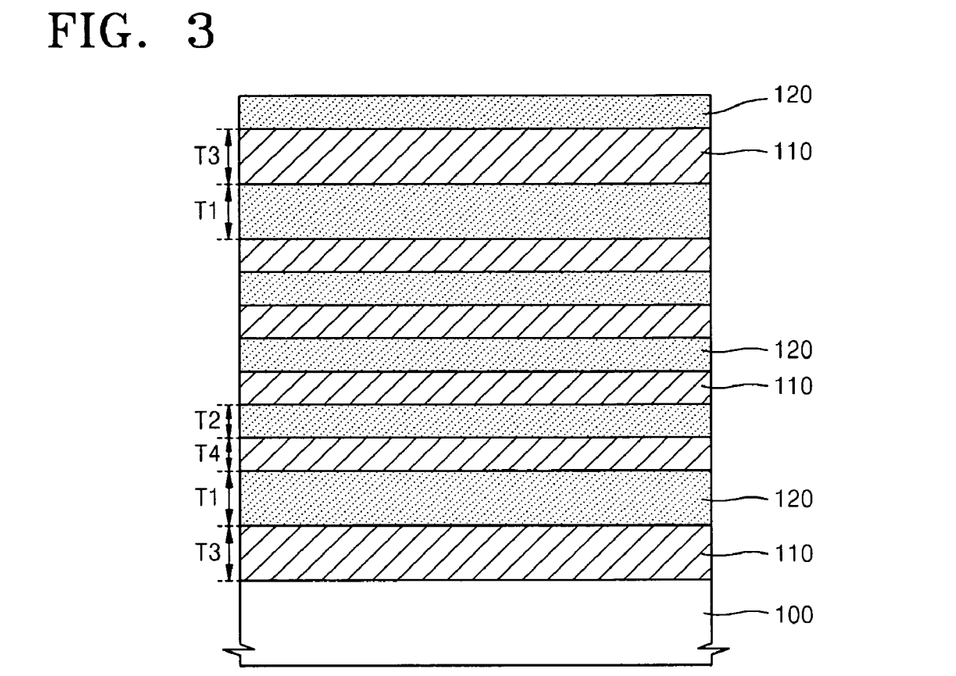
FIGS. 3 to 10 are schematic cross-sectional views of a method of fabricating the non-volatile memory device of FIGS. 1 and 2 according to an example embodiment.
Figure 10:
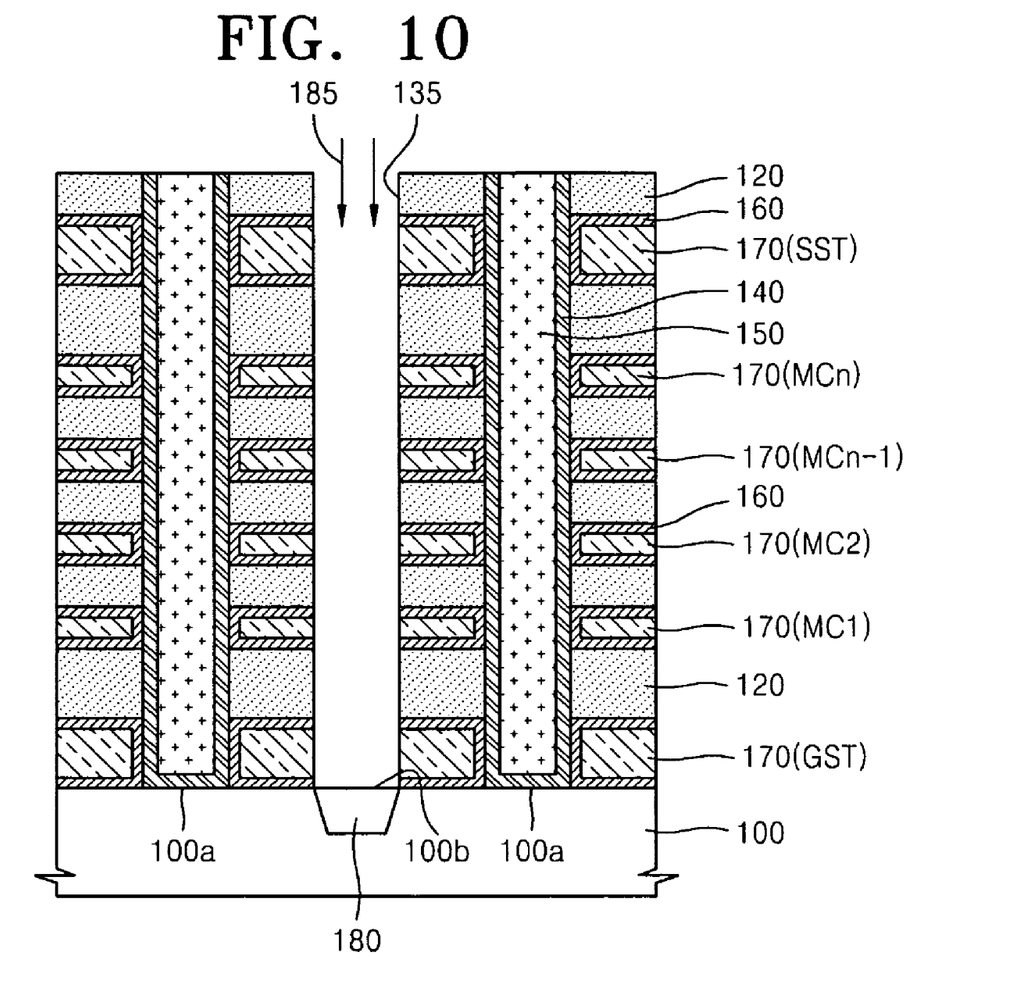

FIGS. 3 and 10 are schematic cross-sectional views of a method of fabricating the non-volatile memory device of FIGS. 1 and 2 according to an example embodiment. Referring to FIG. 3, a plurality of sacrificial films 110 and the insulation films 120 may be alternately and sequentially stacked on the semiconductor substrate 100. One of the sacrificial films 110 may be arranged on the semiconductor substrate 100. One of the insulation films 120 may be arranged on the top of the stack. The number of the sacrificial films 110 may be arranged to correspond to the number of the SSTs and GSTs and the memory cells MC1-MCn included in the cell string units 11 shown in FIGS. 1 and 2.

The sacrificial films 110 may contain a material having an etching selectivity relative to the insulation films 120. The insulation films 120 may contain silicon nitride films. Among the insulation films 120, a thickness T1 of a lower insulation film arranged on the lowest sacrificial film of the sacrificial films 110 and an upper insulation film arranged under the highest sacrificial film of the sacrificial films 110 may be greater than a thickness T2 of intermediate insulation films arranged between the lower insulation film and the upper insulation film.

The sacrificial films 110 may contain silicon oxide films. The number of the sacrificial films 110 may correspond to the number of the SSTs and GSTs and the memory cells $MC_1$-$MC_n$ included in the cell string units 11. Among the sacrificial films 110, a thickness T3 of the lowest sacrificial film and the highest sacrificial film may be greater than a thickness T4 of intermediate sacrificial films arranged between the lowest sacrificial film and the highest sacrificial film.

Figure 4:
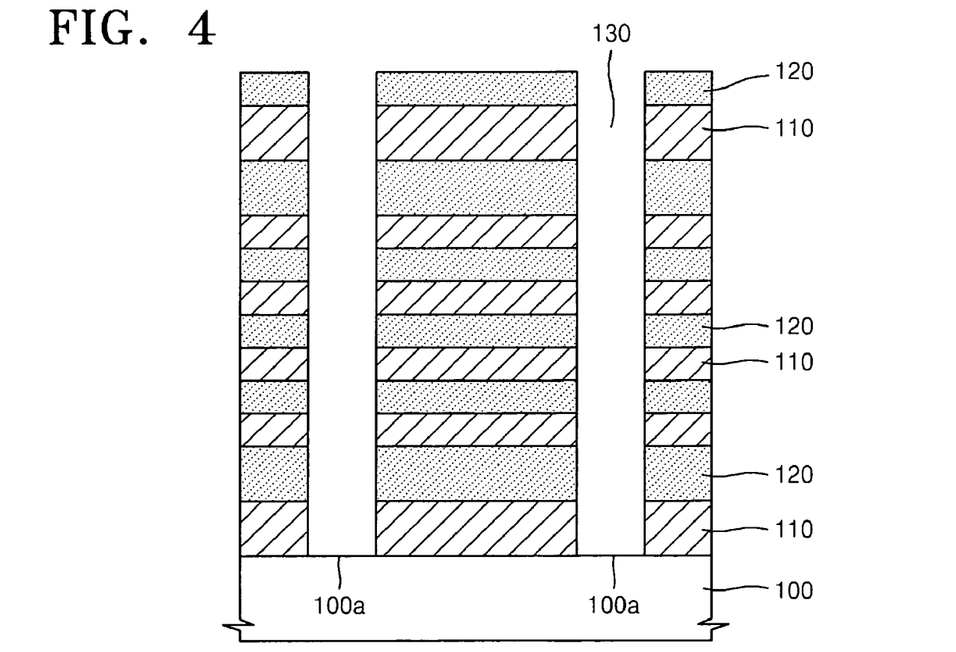

Referring to FIG. 4, a photosensitive film (not shown) may be formed on the highest insulation film 120. The photosensitive film may be formed to expose parts of the highest insulation film 120 corresponding to the first portions 100a of the semiconductor substrate 100 in which a channel contact is to be formed. The first openings 130 may be formed in the sacrificial films 110 and the insulation films 120 by etching the sacrificial films 110 and the insulation films 120 using the photosensitive film as an etching mask. The first portions 100a of the semiconductor substrate 100 may be exposed through the first openings 130. The photosensitive film may be removed.

Figure 5:
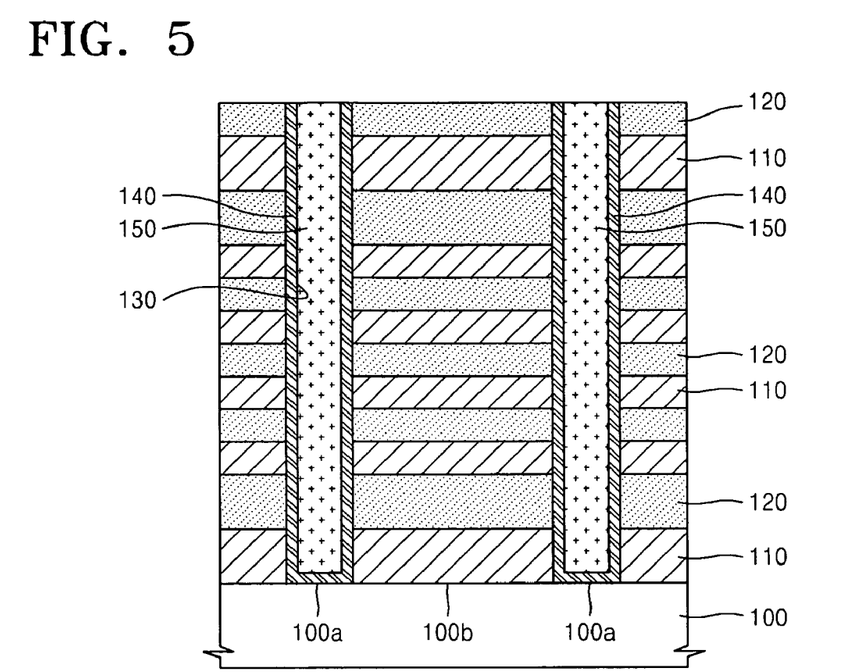

Referring to FIG. 5, the channel layers 140 may be formed on bottom surfaces and side surfaces of the first openings 130. The channel layers 140 may be formed to contact the exposed first portions 100a of the semiconductor substrate 100 through the first openings 130. The channel layers 140 may contain semiconductor layers. The semiconductor layers 140 may contain polysilicon films. The insulation pillars 150 may be formed on the channel layers 140 so as to entirely fill the first openings 130. The insulation pillars 150 may contain oxide films.

Figure 6:
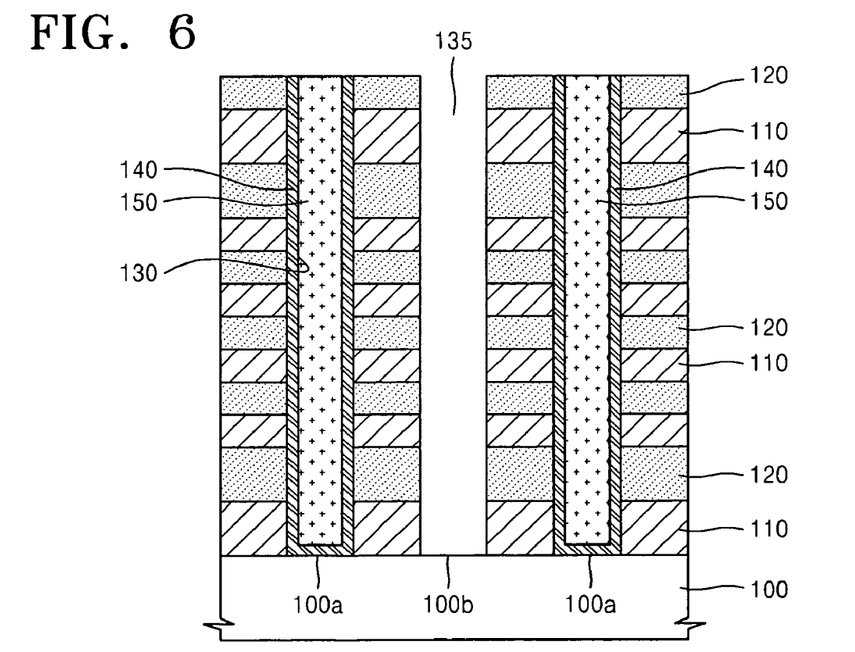

Referring to FIG. 6, a photosensitive film (not shown) may be formed on the highest insulation film 120, the channel layers 140, and the insulation pillars 150. The photosensitive film may expose parts of the highest insulation film 120 corresponding to the second portions 100b of the semiconductor substrate 100 in which a plurality of common source regions between the insulation pillars 150 are to be formed.

The second openings 135 may be formed exposing the second portions 100b of the semiconductor substrate 100 between the first portions 100a by etching the sacrificial films 110 and the insulation films 120 using the photosensitive film as an etching mask. Side surfaces of the sacrificial films 110 and the insulation films 120 may be exposed through the second openings 135.

Figure 7:
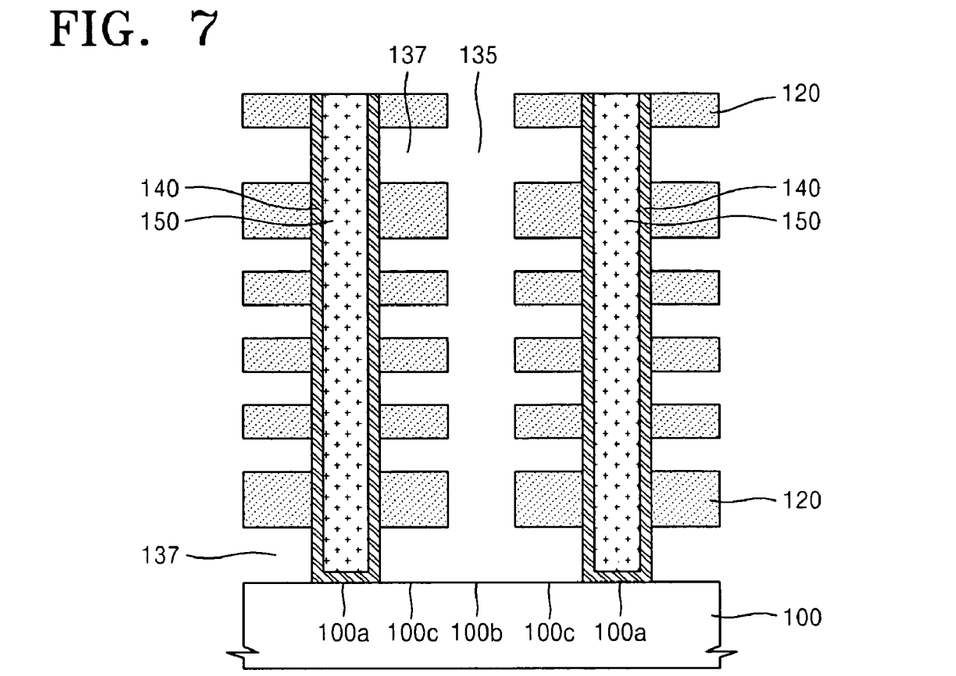

Referring to FIG. 7, the sacrificial films 110 exposed through the second openings 135 may be removed. The sacrificial films 110 may be entirely removed using an oxide film etchant in a wet etching process. The removal of the sacrificial films 110 may form side openings 137 extending from side surfaces of the second openings 135. The side openings 137 may expose parts of the channel layers 140 and third portions 100c adjacent to the second portions 100b of the semiconductor substrate 100. The side openings 137 may define regions where word lines are to be formed using a subsequent process.

Figure 8:
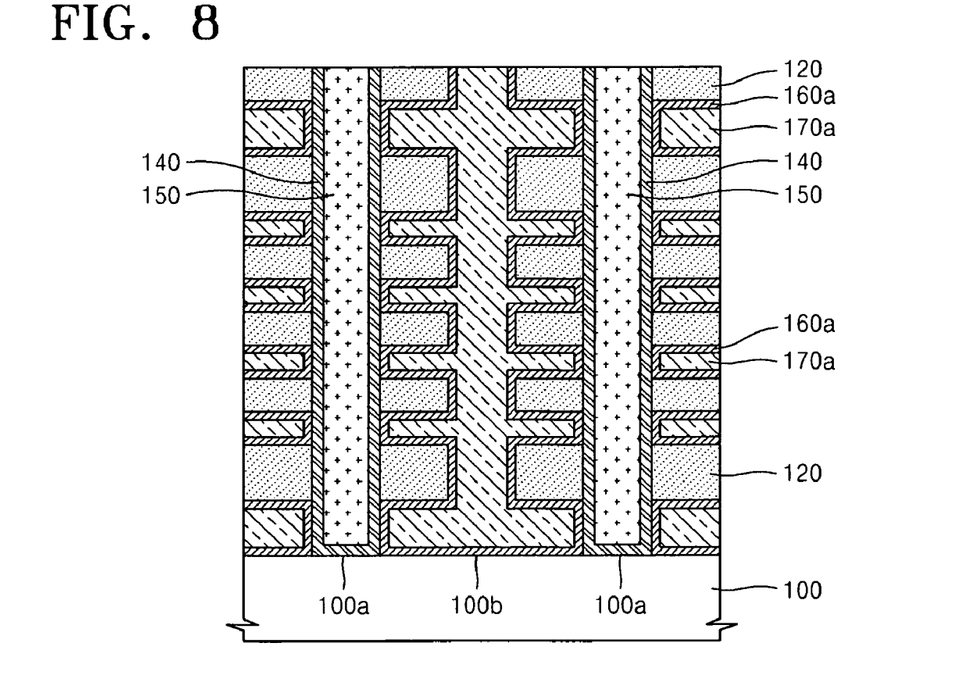

Referring to FIG. 8, a dielectric layer 160a may be formed on surfaces of the side openings 137, surfaces of the insulation films 120 exposed by the second openings 135, and the second portions 100b of the semiconductor substrate 100 exposed by the second openings 135. A conductive film 170a may be formed on the dielectric film 160a so that the side openings 137 and the second openings 135 are completely filled.

Figure 9:
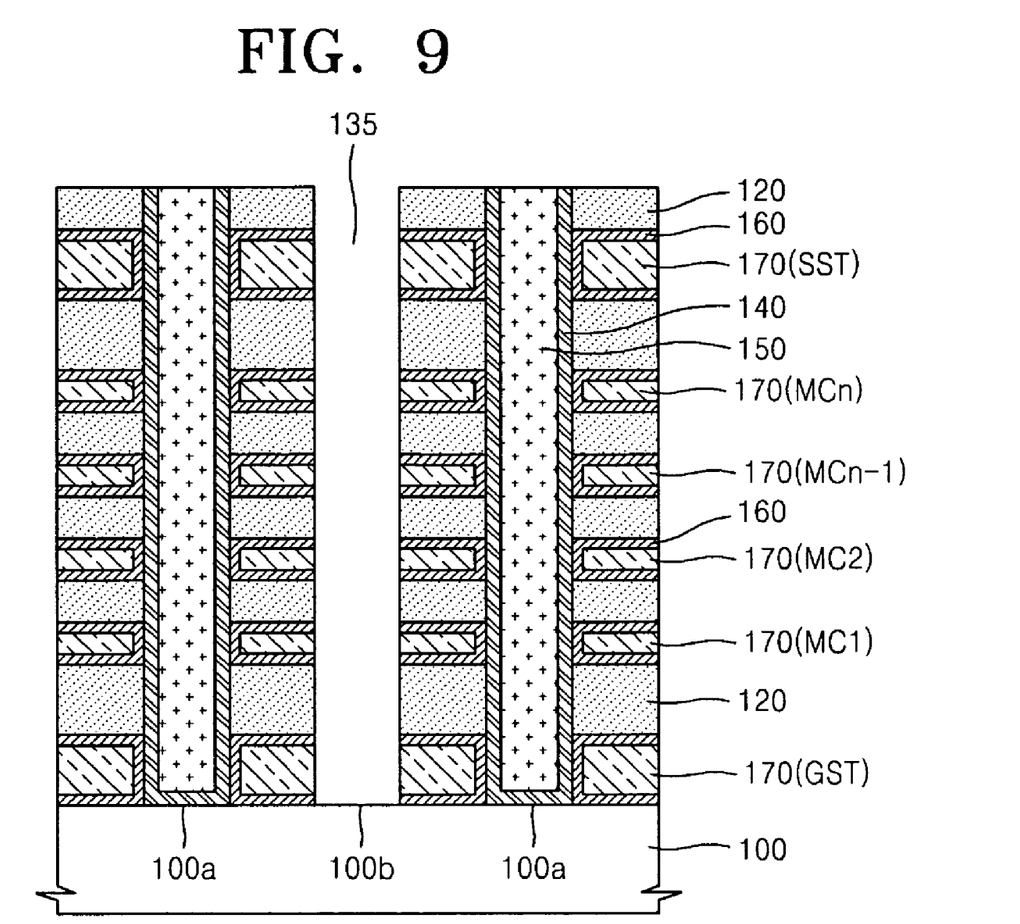

Referring to FIG. 9, the gate dielectric films 160 and the gate electrodes 170 may be formed by etching the dielectric films 160a and the conductive film 170a in the second openings 135. Portions of the dielectric film 160a arranged on side surfaces of the insulation films 120 and the second portions 100b of the semiconductor substrate 100 and the conductive film 170a of the second openings 135 may be etched using an etching-back process. The gate dielectric films 160 may be arranged on surfaces of the side openings 137, and the gate electrodes 170 may be formed on the gate dielectric films 160 so as to completely fill in the side openings 137.

Each of the gate dielectric film 160 may include a tunneling layer, a charge storage layer, and a charge blocking layer. The gate dielectric films 160 may include ONA or ONOA. The gate electrodes 170 may include the ground selecting gate electrodes 170 GST of the GSTs, the memory cell gate electrodes 170 MC1-MCn of the memory cells $MC_1$-$MC_n$, and the string selecting gate electrodes 170 SST of the SSTs shown in FIGS. 1 and 2.

Referring to FIG. 10, the impurity regions 180 may be formed by ion-injecting impurities 185 into the second portions 100b of the semiconductor substrate 100 exposed through the second openings 135. The impurity regions 180 may act as common source regions. Thereafter, the bit lines 190 contacting the channel layers 140 may be formed on the highest insulation film 120 by performing a bit line forming process.

Figure 11:
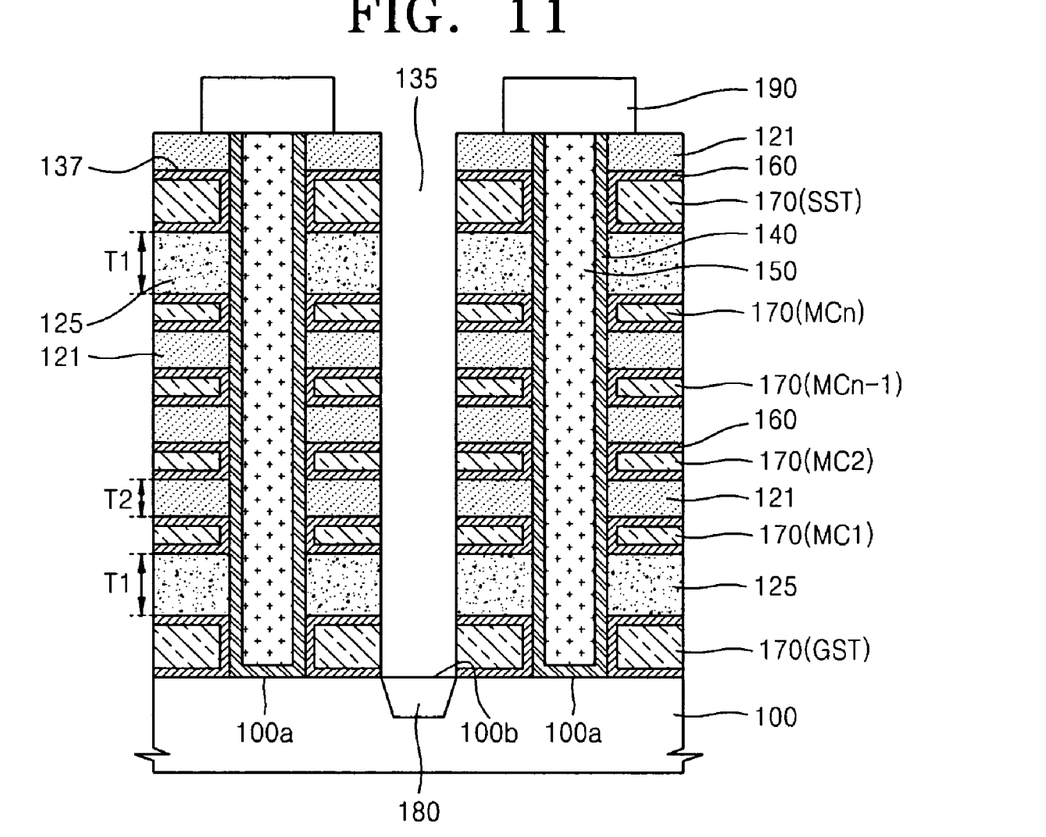
FIG. 11 is a schematic cross-sectional view of another non-volatile memory device having a vertical structure according to an example embodiment.

FIG. 11 is a schematic cross-sectional view of another non-volatile memory device having a vertical structure according to an example embodiment. Referring to FIGS. 1, 2, and 11, a plurality of second insulation films 125 may be arranged between the string selecting gate electrode 170 SST of the SSTs and the memory cell gate electrode 170 $MC_n$ of the memory cell transistor $MC_n$ and between the ground selecting gate electrode 170 GST of the GSTs and the memory cell gate electrode 170 $MC_1$ of the memory cell transistor $MC_1$. A plurality of first insulation films 121 may be arranged between the memory cell gate electrodes 170 $MC_1$-$MC_n$ of the memory cells $MC_1$-$MC_n$ and on the string selecting gate electrodes 170 SST.

The first insulation films 121 and the second insulation films 125 may include interlayer insulation films. A thickness T1 of the second insulation films 125 may be greater than a thickness T2 of the first insulation films 121. The second insulation films 125 may include a material having a dielectric constant lower than that of the first insulation films 121. The first insulation films 121 may include silicon nitride films, and the second insulation films 125 may include silicone oxynitride films (SiON).

The non-volatile memory device shown in FIG. 11 may differ from the non-volatile memory device shown in FIG. 2 with regard to an arrangement structure of the insulation films. A method of fabricating the non-volatile memory device shown in FIG. 11 may be the same as the method of fabricating the non-volatile memory device shown in FIG. 2 although other suitable methods may be employed.

Figure 12:
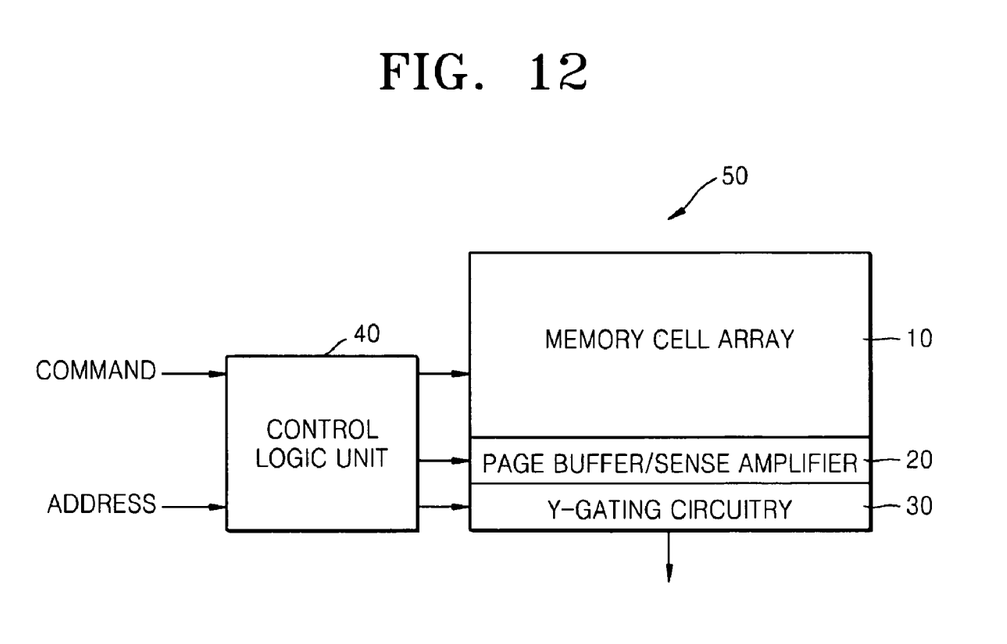
FIG. 12 is a schematic block diagram of a non-volatile memory device according to an example embodiment.

FIG. 12 is a schematic block diagram of a non-volatile memory device 50 according to an example embodiment. Referring to FIG. 12, the non-volatile memory device 50 may include a memory cell array 10, a page buffer/sense amplifier 20, a Y-gating circuitry 30, and a control/decoder circuitry 40.

The memory cell array 10 may include the non-volatile memory devices shown in FIGS. 2 and 11. The page buffer/sense amplifier 20 may amplify and temporarily store data that is to be recorded onto the memory cell array 10 or data read from the memory cell array 10.

The Y-gating circuitry 30 may transmit the data stored in the page buffer/sense amplifier 20. The control/decoder circuitry 40 may receive commands CMD and addresses externally, output control signals for writing data onto or reading data from the memory cell array 10, and decode the received addresses. The control/decoder circuitry 40 may provide the SSLs, GSLs, and word lines $WL_1$-$WL_n$ with driving signals. The control/decoder circuitry 40 may output control signals for inputting into and outputting from the page buffer/sense amplifier 20, and provide the Y-gating circuitry 30 with address information.

Figure 13:
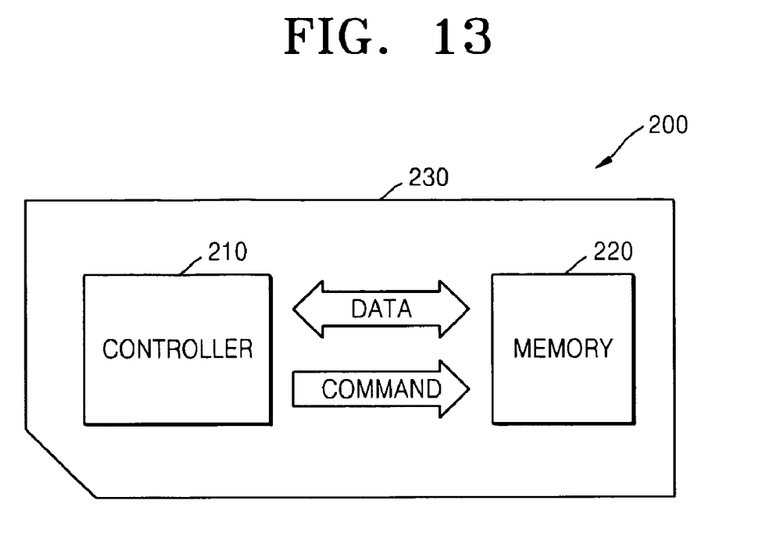
FIG. 13 is a schematic block diagram of a memory card according to an example embodiment.

FIG. 13 is a schematic block diagram of a memory card 200 according to an example embodiment. Referring to FIG. 13, the memory card 200 may include a controller 210 and a memory 220 in a housing 230. The controller 210 and the memory 220 may exchange an electrical signal with each other. For example, data may be exchanged between the memory 220 and the controller 210 in response to commands given from the controller 210. Thus, the memory card 200 may store data in the memory 220 or may output data stored in the memory 220 to the outside. The memory 220 may include the non-volatile memory devices shown in FIGS. 2 and 11.

The memory card 200 may be used as a data storage medium in various portable apparatuses. For example, the memory card 200 may be a memory stick card, a smart media (SM) card, a secure digital (SD) card, a mini secure digital (mini SD) card, or a multi media card (MMC).

Figure 14:
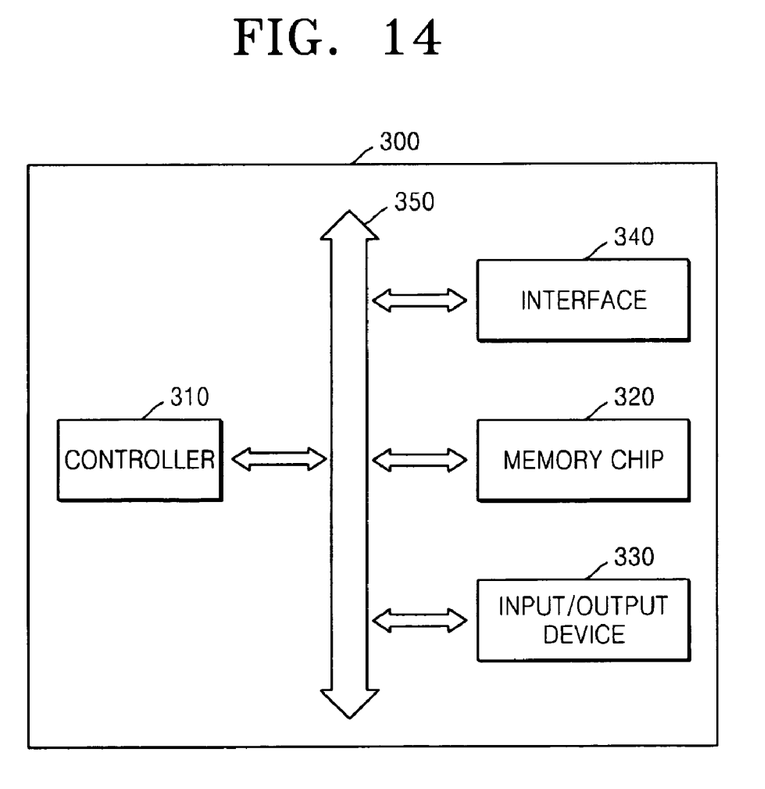
FIG. 14 is a schematic block diagram of an electronic system according to an example embodiment.

FIG. 14 is a schematic block diagram of an electronic system 300 according to an example embodiment. Referring to FIG. 14, the electronic system 300 may include a processor 310, a memory chip 320, an input/output device 330, and an interface 340. The processor 310 may execute a program and control the memory chip 320 and the input/output device 330. The input/output device 330 may be used to input data to or output data from the electronic system 300 or an external device (not shown), e.g., a personal computer or a network. The interface 340 may be used to interface the external device. The processor 310, the memory chip 320, the input/output device 330, and the interface 340 may communicate data via a bus 350.

The electronic system 300 may constitute various electronic control apparatuses that need the memory chip 320. The electronic system 300 may be used in mobile phones, MP3 players, navigation devices, solid state disks (SSDs), or household appliances.

While various examples have been particularly shown and described with reference to the embodiments herein, it will be understood that various changes in form and details may be made without departing from the spirit and scope of the following claims.

The invention claimed is:

1. A method of fabricating a non-volatile memory device having a vertical structure, comprising:

alternately stacking a plurality of sacrificial films and a plurality of insulation films on a semiconductor substrate;

removing a part of the plurality of sacrificial films and the plurality of insulation films to form a plurality of first openings that expose a plurality of first portions of the semiconductor substrate;

forming a plurality of channel layers in the plurality of first openings so as to cover the plurality of first portions of the semiconductor substrate and side surfaces of the plurality of first openings;

forming a plurality of insulation pillars on the plurality of channel layers so as to fill the plurality of first openings;

removing a part of the plurality of sacrificial films and the plurality of insulation films to form a plurality of second openings that expose a plurality of second portions of the semiconductor substrate;

removing the plurality of sacrificial films exposed by the plurality of second openings to form a plurality of side openings that expose parts of the plurality of channel layers;

forming a plurality of gate dielectric films on surfaces of the plurality of side openings;

forming a plurality of gate electrodes on the plurality of gate dielectric films such that the plurality of side openings are filled; and ion-injecting impurities into the plurality of second portions of the semiconductor substrate to form a plurality of common conjunction regions.

2. The method of claim 1, wherein forming the plurality of gate electrodes includes:

forming a ground selecting gate electrode in a lowest side opening of the plurality of side openings;

forming a string selecting gate electrode in a highest side opening of the plurality of side openings; and forming a plurality of memory cell gate electrodes in the plurality of side openings between the lowest side opening and the highest side opening.

3. The method of claim 2, wherein stacking the plurality of insulation films includes forming an upper insulation film, a lower insulation film, and intermediate insulation films therebetween, a thickness of the upper insulation film between the string selecting gate electrode and an adjacent memory cell gate electrode and a thickness of the lower insulation film between the ground selecting gate electrode and an adjacent memory cell gate electrode being greater than a thickness of the intermediate insulation films between the memory cell gate electrodes.

4. The method of claim 3, wherein stacking the plurality of sacrificial films and the plurality of insulation films includes forming the plurality of sacrificial films of a material having an etching selectivity relative to the plurality of insulation films.

5. The method of claim 4, wherein stacking the plurality of sacrificial films and the plurality of insulation films includes forming the plurality of sacrificial films of silicon oxide and forming the plurality of insulation films of silicon nitride.

6. The method of claim 2, wherein stacking the plurality of insulation films includes forming an upper insulation film, a lower insulation film, and intermediate insulation films therebetween, the upper insulation film arranged between the string selecting gate electrode and an adjacent memory cell gate electrode and the lower insulation film arranged between the ground selecting gate electrode and an adjacent memory cell gate electrode, the upper insulation film and the lower insulation film formed of a material having a lower dielectric constant than that of the intermediate insulation films.

7. The method of claim 6, wherein forming the upper insulation film, the lower insulation film, and the intermediate insulation films includes forming the upper insulation film and the lower insulation film of silicon oxide and forming the intermediate insulation films of silicon nitride.

8. The method of claim 1, wherein forming the plurality of gate dielectric films and the plurality of gate electrodes includes:
   forming a dielectric film on surfaces of the plurality of second openings, the plurality of side openings, and the plurality of second portions of the semiconductor substrate;
   forming a conductive film on the dielectric film such that the plurality of side openings and the plurality of second openings are filled; and
   etching back the dielectric film and conductive film in the plurality of second openings to form the plurality of gate dielectric films and gate electrodes.

9. The method of claim 8, wherein forming the plurality of gate dielectric films includes forming the dielectric film of oxide-nitride-alumina (ONA) or oxide-nitride-oxide-alumina (ONOA).

10. The method of claim 1, wherein forming the plurality of channel layers includes forming the plurality of channel layers of polysilicon.

11. A method of fabricating a non-volatile memory device, comprising:
   removing a part of a plurality of sacrificial films and insulation films from a stack of sacrificial films and insulation films alternately arranged on a semiconductor substrate to form a first opening that exposes a first portion of the semiconductor substrate;
   covering surfaces of the first opening with a channel layer;
   forming an insulation pillar in the first opening;
   removing a part of the sacrificial films and insulation films to form a second opening that exposes a second portion of the semiconductor substrate;
   removing the plurality of sacrificial films to form a plurality of side openings that expose parts of the channel layer;
   forming a plurality of gate dielectric films on surfaces of the plurality of side openings;
   forming a plurality of gate electrodes in the plurality of side openings; and
   forming a common conjunction region in the second portion of the semiconductor substrate.

12. The method of claim 11, wherein forming the plurality of gate electrodes includes:
   forming memory cell gate electrodes in intermediate side openings of the plurality of side openings;
   forming a string selecting gate electrode in a side opening above the memory cell gate electrodes; and
   forming a ground selecting gate electrode in a side opening below the memory cell gate electrodes.

13. The method of claim 12, wherein stacking the plurality of insulation films includes forming a lower insulation film, intermediate insulation films on the lower insulation film, and an upper insulation film on the intermediate insulation films, a thickness of the upper insulation film and a thickness of the lower insulation film being greater than a thickness of the intermediate insulation films.

14. The method of claim 13, wherein stacking the plurality of sacrificial films and insulation films includes forming the sacrificial films of a material having an etching selectivity relative to the insulation films.

15. The method of claim 14, wherein stacking the plurality of sacrificial films and insulation films includes forming the sacrificial films of silicon oxide and forming the insulation films of silicon nitride.

16. The method of claim 12, wherein stacking the plurality of insulation films includes forming a lower insulation film, intermediate insulation films on the lower insulation film, and an upper insulation film on the intermediate insulation films, the upper insulation film and lower insulation film formed of a material having a lower dielectric constant than that of the intermediate insulation films.

17. The method of claim 16, wherein forming the upper insulation film, the lower insulation film, and the intermediate insulation films includes forming the upper insulation film and the lower insulation film of silicon oxide and forming the intermediate insulation films of silicon nitride.

18. The method of claim 11, wherein forming the plurality of gate dielectric films and the plurality of gate electrodes includes:
   covering surfaces of the plurality of side openings with a dielectric film;
   forming a conductive film in the plurality of side openings.

19. The method of claim 18, wherein forming the plurality of gate dielectric films includes forming the dielectric film of oxide-nitride-alumina (ONA) or oxide-nitride-oxide-alumina (ONOA).

20. The method of claim 11, wherein covering surfaces of the first opening with the channel layer includes forming the channel layer of polysilicon.

* * * * *